(12) United States Patent
Lin et al.

(10) Patent No.: US 6,669,185 B2
(45) Date of Patent: Dec. 30, 2003

(54) WAFER LOADING SYSTEM POSITIONING METHOD AND DEVICE

(75) Inventors: Wu-Lang Lin, Tai-Chung Hsien (TW); Kuan-Chou Chen, Hsin-Chu (TW); Ping-Yu Hu, Hsin-Chu (TW); Muh-Wang Liang, Miao-Li Hsien (TW); Kuei-Jung Chen, Miao-Li (TW); Tzong-Ming Wu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/736,664

(22) Filed: Dec. 8, 2000

(65) Prior Publication Data

US 2002/0041066 A1 Apr. 11, 2002

(30) Foreign Application Priority Data

Oct. 11, 2000 (TW) ........................................ 89121229 A (51) Int. Cl.$^7$ ................................................ B65G 65/34
(52) U.S. Cl. ....................... 269/309; 414/404; 414/417; 414/937; 269/903; 118/500; 118/719
(58) Field of Search .................................. 414/404, 217, 414/935, 932, 403, 249, 416; 269/309, 903; 254/939, 940, 133 R; 118/500, 719

(56) References Cited

U.S. PATENT DOCUMENTS

| 5,153,841 A | * | 10/1992 | Goff et al. ................... 700/228 |
| 5,566,840 A | * | 10/1996 | Waldner et al. ........... 211/41.17 |
| 6,368,044 B1 | * | 4/2002 | Nichols et al. ............. 414/404 |

* cited by examiner

*Primary Examiner*—Joseph J. Hail, III
*Assistant Examiner*—Daniel Shanley
(74) *Attorney, Agent, or Firm*—Pro-Techtor International Services (57) ABSTRACT

A wafer loading system positioning method and device, comprising a loading system, having a base and a rear plate for docking on a positioning frame of a production equipment. The main characteristic thereof is that the loading system in an upper part of the rear plate has a holding seat and the positioning frame in an upper part of a front side has an upward extending positioning element. Two eccentric cams on the holding seat and the positioning element allow to adjust a relative position of the holding seat with respect to the positioning element. A lifting mechanism enables raising of the loading system for lifting said holding seat above said positioning element, so as to enable said holding seat to engage with said positioning element.

13 Claims, 13 Drawing Sheets

WAFER LOADING SYSTEM POSITIONING METHOD AND DEVICE

BACKGROUND OF THE INVENTION

1. Field of the Invention

The present invention relates to a wafer loading system positioning method and device, particularly to a wafer loading system positioning method and device which establishes an interface between a loading system and a production equipment in a semiconductor production process.

2. Description of Related Art

Conventionally, at production of semiconductors like wafers and flat panel displays, wafer pods are needed to transport semiconductor wafers or other substrates. Furthermore, a transporting device is used for carrying wafer pods to each production equipment to perform various working steps.

The main function of a wafer pod is to accommodate wafers and all kinds of substrates. The wafer pod is filled with clean protective gas to avoid contaminating of the wafers and substrates with air or dust. On every production equipment input and output ports are required to load wafers and substrates isolated from the environment. Furthermore, a loading device is needed as an intermediary between the wafer pod and the input and output ports of the production equipment for opening the wafer pod and placing the wafers and substrates contained therein in the input and output ports of the production equipment.

However, due to changes in the production process or order of process, often a need arises during production to exchange the loading device of the production equipment. Therefore the loading device requires the ability to be installed and positioned quickly to fulfill demands of semiconductor production flexibility.

As an SEMI standard for semiconductor production, a interface frame is set between the loading device and the production equipment. The interface frame serves to install and position the loading device. Between the interface frame and the loading device, six threaded holes for positioning are provided, allowing a user to fix the input port and the interface frame of the production equipment to each other with screws.

However, in a conventional semiconductor production facility, only screws connect the loading device and the production equipment. Therefore, for mounting the loading device, all the threaded holes have to be aligned to insert the screws. After inserting the screws, angle and position of the loading device have to be adjusted manually. Mounting and positioning of a conventional loading device for semiconductor production is therefore difficult and time consuming.

Figure 6:
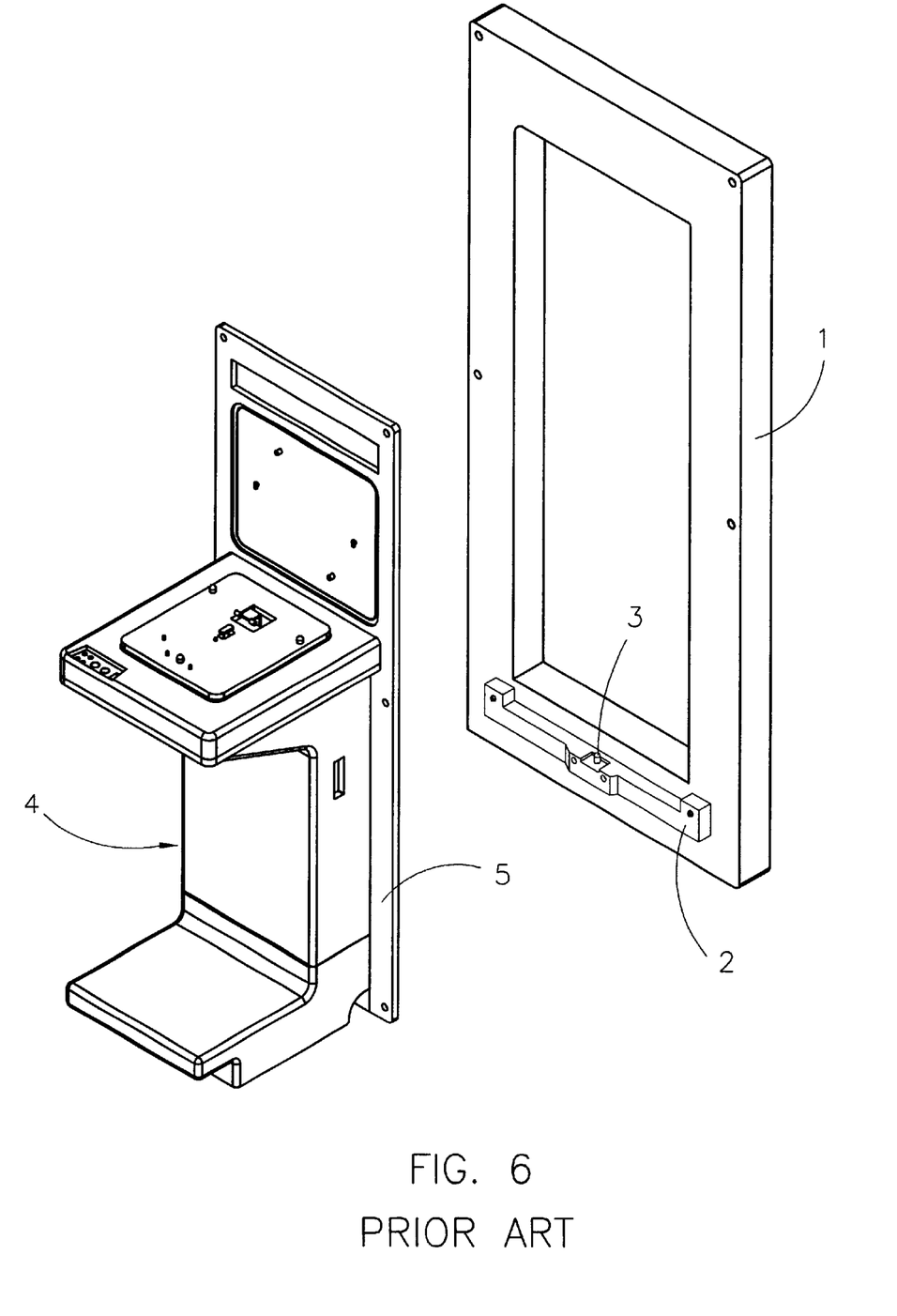
FIG. 6 (prior art) is a perspective view of a conventional wafer loading device.

As shown in FIG. 6, in international publication No. WO 99/12191, a wafer load port is disclosed which is mainly characterized by a positioning frame 1 of the production equipment having a forward protruding positioning base 2 on a lower end. The positioning base 2 has a middle part from which a positioning bolt 3 extends upward. The positioning frame 1 allows to mount a loading device 4 thereon, so that the loading device 4 is fastened on the production equipment at an appropriate position. The loading device 4 has a rear plate 5 to be fixed on the positioning frame 1 by screws. The rear plate has a lower side carrying a holding seat 6.

Figure 7:
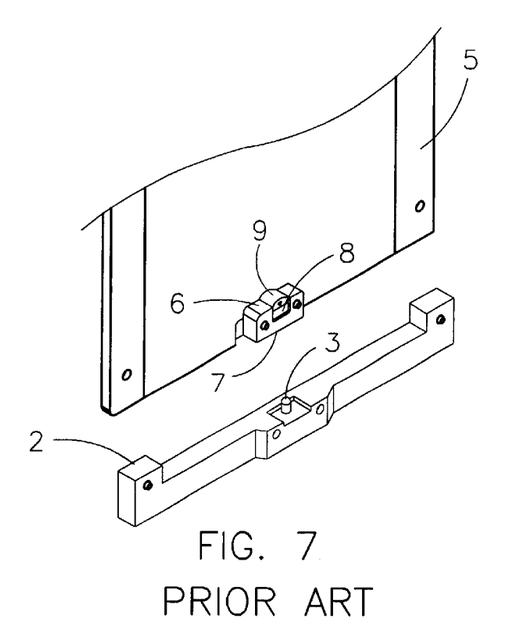
FIG. 7 (prior art) is a perspective view of a connecting device of a conventional wafer loading device.

Referring to FIG. 7, at a lower part of the holding seat 6 at a middle position, a holding groove 7 is cut in, to engage with an upper end of the positioning bolt 3. Between the holding seat 6 and the rear plate 5 of the positioning base 2 some free lateral motion is allowed. A projection 8 extends from an upper part of the holding seat 6 at a middle position. An eccentric cam 9 is mounted on the rear plate 5, engaging with the projection 8, so that the holding seat 6 has a movable relative position on the rear plate 5.

Figure 8:
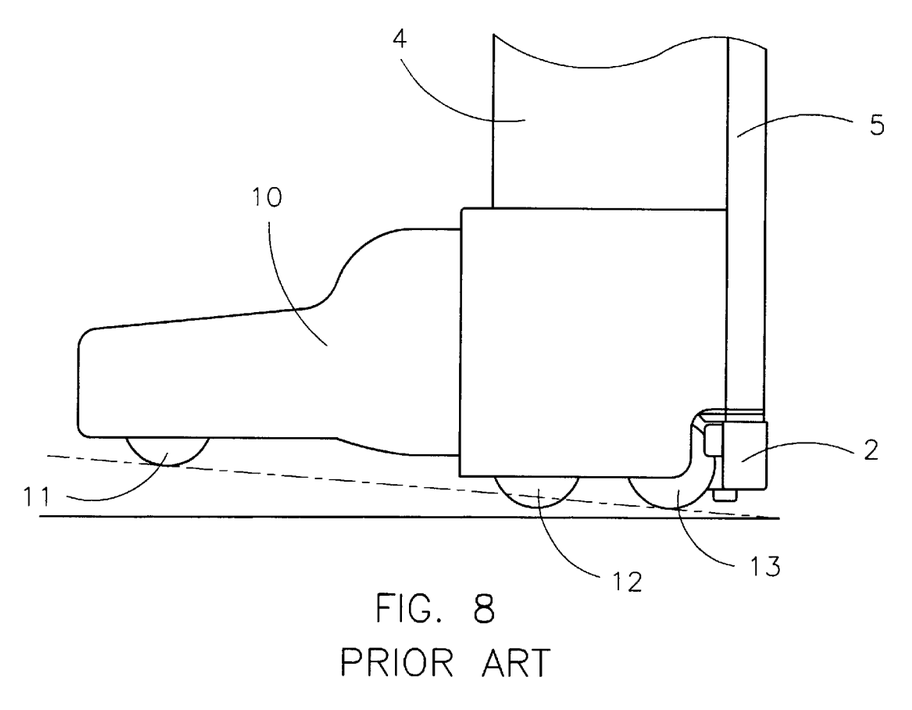
FIG. 8 (prior art) is a schematic illustration of the movement for docking a conventional wafer loading device.

Referring to FIG. 8, the loading device 4 has a lower part with a base 10, on which three pairs of rolls 11, 12, 13 are mounted. The base 10 has a front end that is inclined upward, with the pair of rolls 11 in a forward position being placed relatively high and the pairs of rolls 12, 13 in rear positions being placed relatively low. Thus, when a user docks the loading device 4 on the positioning frame 1, she or he presses down the front end of the base 10, inclining the loading device 4 forward and raising the holding seat 6, mounted on the rear side of the rear plate 5, allowing the holding groove 7 to engage with the positioning bolt 3. Then the user pushes the positioning frame 1 rearward, so that the rear plate 5 leans against the positioning frame 1 and the holding seat 6 is held on the positioning bolt 3.

The positioning bolt 3 on a lower part thereof is threaded to be screwed on the positioning base 2. This allows the positioning bolt 3 by turning to be adjusted vertically to the loading device 4. By turning the eccentric cam 9, the lateral position of the holding seat 6 is changed, adjusting the loading device 4 horizontally to the positioning frame 1.

Although the cited publication improves on the shortcoming of difficult positioning of conventional wafer load port and increases the speed of docking the loading device on the production equipment, the following disadvantages in use remain:

1. The holding seat 6 and the positioning bolt 3 are placed on the lower part of the loading device 4, hidden on the rear side of the rear plate 5. Thus the holding seat 6 and the positioning bolt 3, though allowing to adjust the relative vertical and horizontal positions of the loading device 4 and the positioning frame 1, are difficult to access, making the adjusting work cumbersome.

2. When connecting the holding seat 6 and the positioning bolt 3, the front end of the base 10 of the loading device 4 needs to be pressed down to raise the rear end thereof to allow the holding groove 7 to engage with the positioning bolt 3. Careless handling will cause the loading device to topple and to be damaged.

For the above reasons, conventional loading systems for semiconductor wafer and substrates have many inconvenient features, and there is evidently a need for improvement.

SUMMARY OF THE INVENTION

The main object of the present invention is to provide a wafer loading system positioning method and device allowing fast positioning and lifting a loading device for docking thereof on a production equipment.

The present invention mainly comprises: a lifting mechanism, mounted on the lower part of the loading device, allowing a user to lift the loading device to a controlled height; a connecting seat, mounted on an upper end of a positioning frame of a production equipment; a positioning element, protruding upward from the connecting seat; a holding seat, mounted on the upper end of the loading device and having a lower end with a holding groove for engaging with the positioning element; a vertical adjusting device and a horizontal adjusting device, respectively mounted on the connecting seat and on the holding seat for adjusting the position of the loading device relative to the production equipment; and an inclination adjusting device, mounted on a rear plate on a high middle position thereof for adjusting an angle which determines a gap between the loading device and the production equipment.

In this assembly, the lifting mechanism raises the loading device, so that the holding groove on the holding seat is lifted above the positioning element on the connecting seat, bringing the holding seat and the connecting seat readily into positions for engaging.

The present invention can be more fully understood by reference to the following description and accompanying drawings. The horizontal and vertical adjusting devices and the inclination adjusting device have positions that are directly adjustable using tools, facilitating positioning of the loading device.

DETAILED DESCRIPTION OF THE PREFERRED EMBODIMENTS

Figure 1:
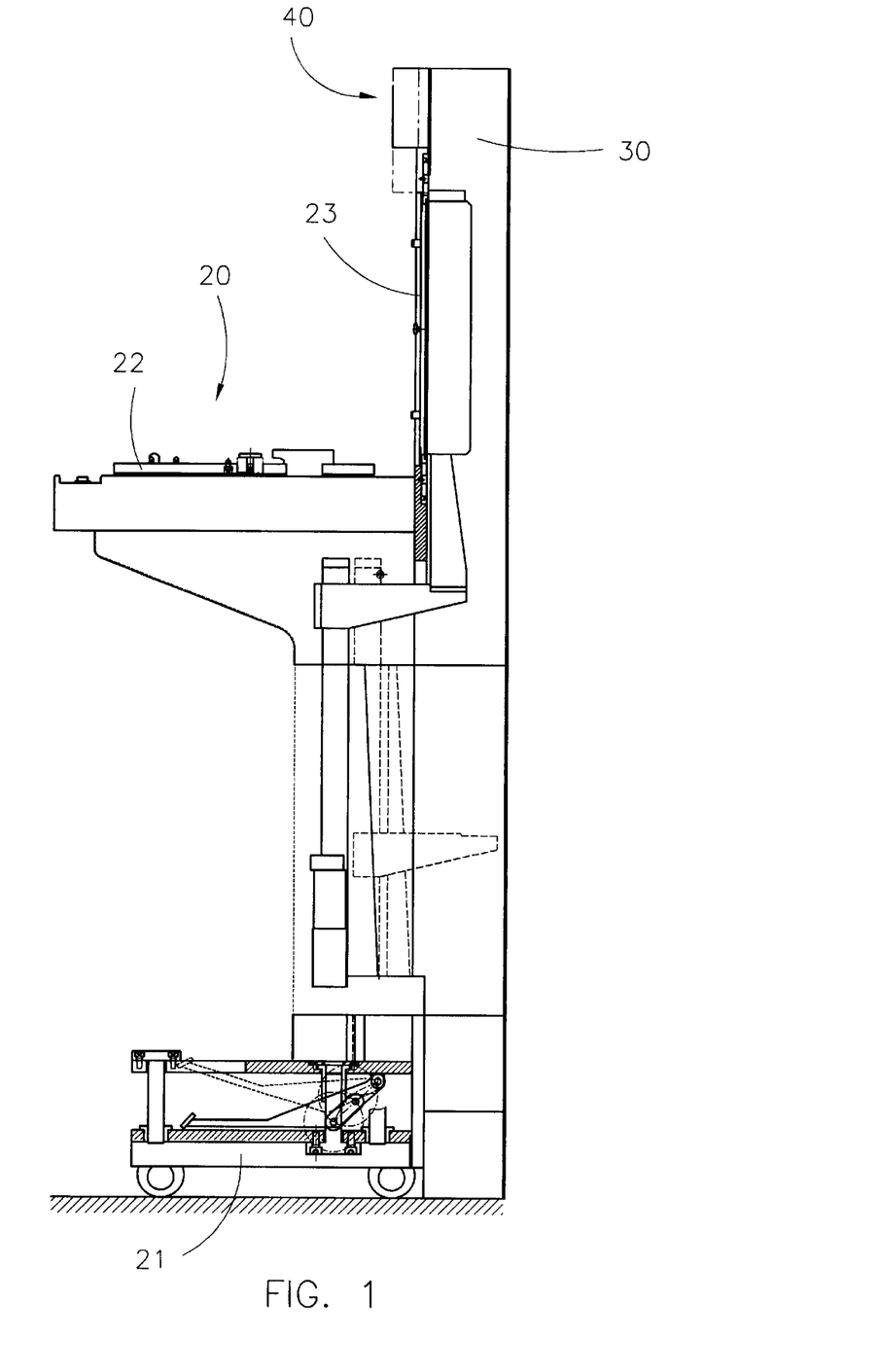
FIG. 1 is a side view of the loading device and the interface frame of the production equipment of the present invention when assembled.
Figure 2:
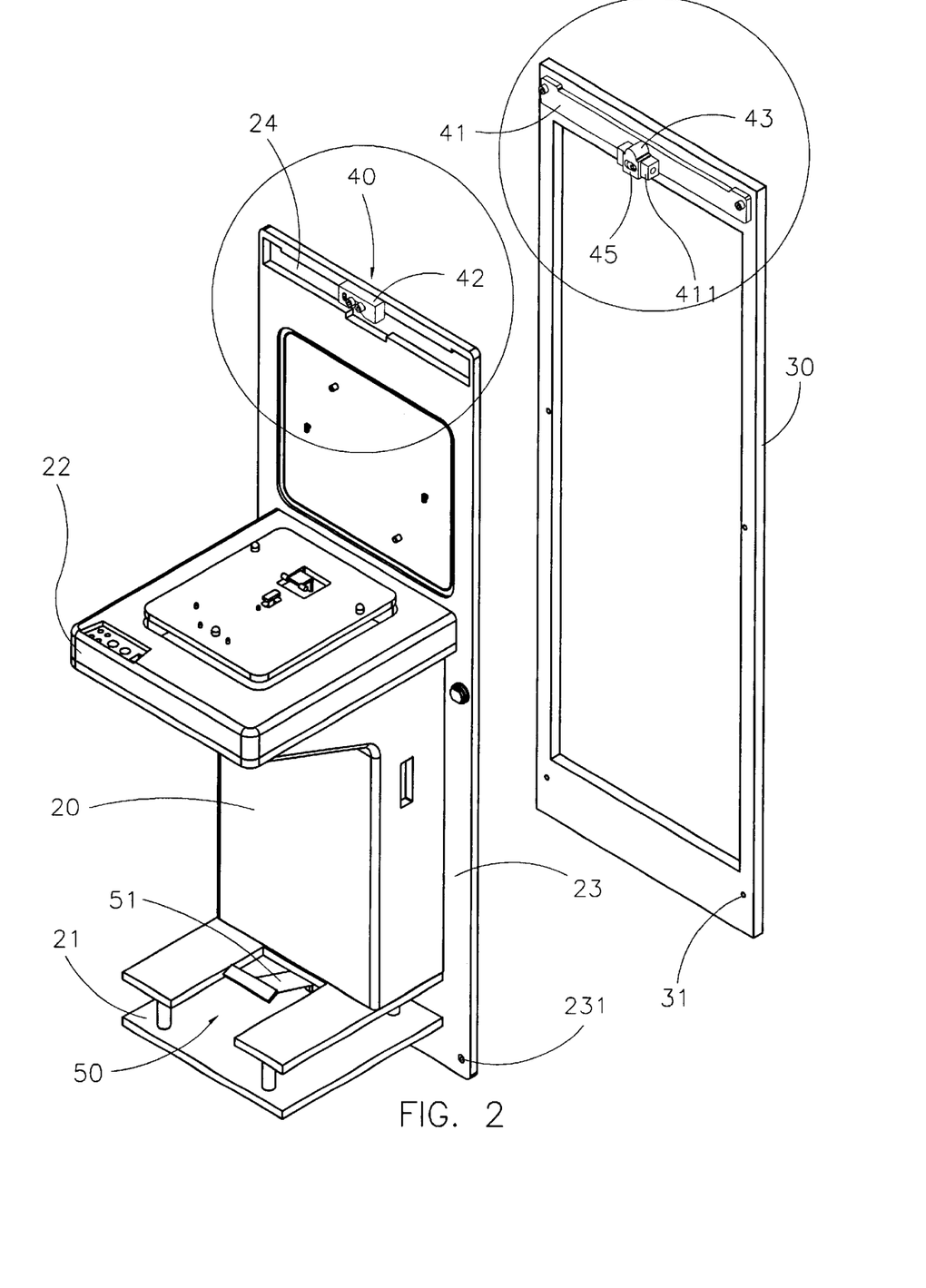
FIG. 2 is a side view of the loading device and the interface frame of the present invention when separated.

As shown in FIG. 1, the wafer loading system positioning device of the present invention has a loading system 20 for semiconductor wafers. The loading system 20 mainly comprises: a base 21, defining a lower part of the loading system 20; a loading table 22 in a vertically middle position on the loading system 20; and a rear plate 23 defining a rear side of the loading system 20. The rear plate 23 leans against a positioning frame 30. The positioning frame 30 is fastened to the front side of a production unit (not shown). As shown in FIG. 2, several holes 231 for countersunk screw heads pass through the rear plate 23, and several threaded holes 31 aligned thereto are bored into the positioning frame 30. By putting screws through the holes 231 into the threaded holes 31, the loading system 20 is fastened to the positioning frame 30.

The rear plate 23 and the positioning frame 30 have upper ends on which a connecting device 40 is mounted. As shown in FIGS. 2A to 2C and 4, the connecting device 40 comprises a connecting seat 41, mounted on the upper end of the positioning frame 30, and a holding seat 42, mounted on the upper end of the rear plate 23. The connecting seat 41 carries a connecting block 45, from which a positioning element 43 protrudes upward. The holding seat 42 has a lower side, into which a holding groove 44 is cut for engaging with the positioning element 43. A through opening 24 is cut into the rear plate 23 on the upper end thereof, at a position that matches the positioning element 43, allowing the positioning element 43 to pass from the rear through the rear plate, reaching the holding seat 42. Thus, when the loading system 20 is connected with the positioning frame 30, pushing of the loading system 20 to the rear puts the positioning element 43 through the opening 24 for engaging the positioning element 43 with the holding seat 42.

Figure 2A:
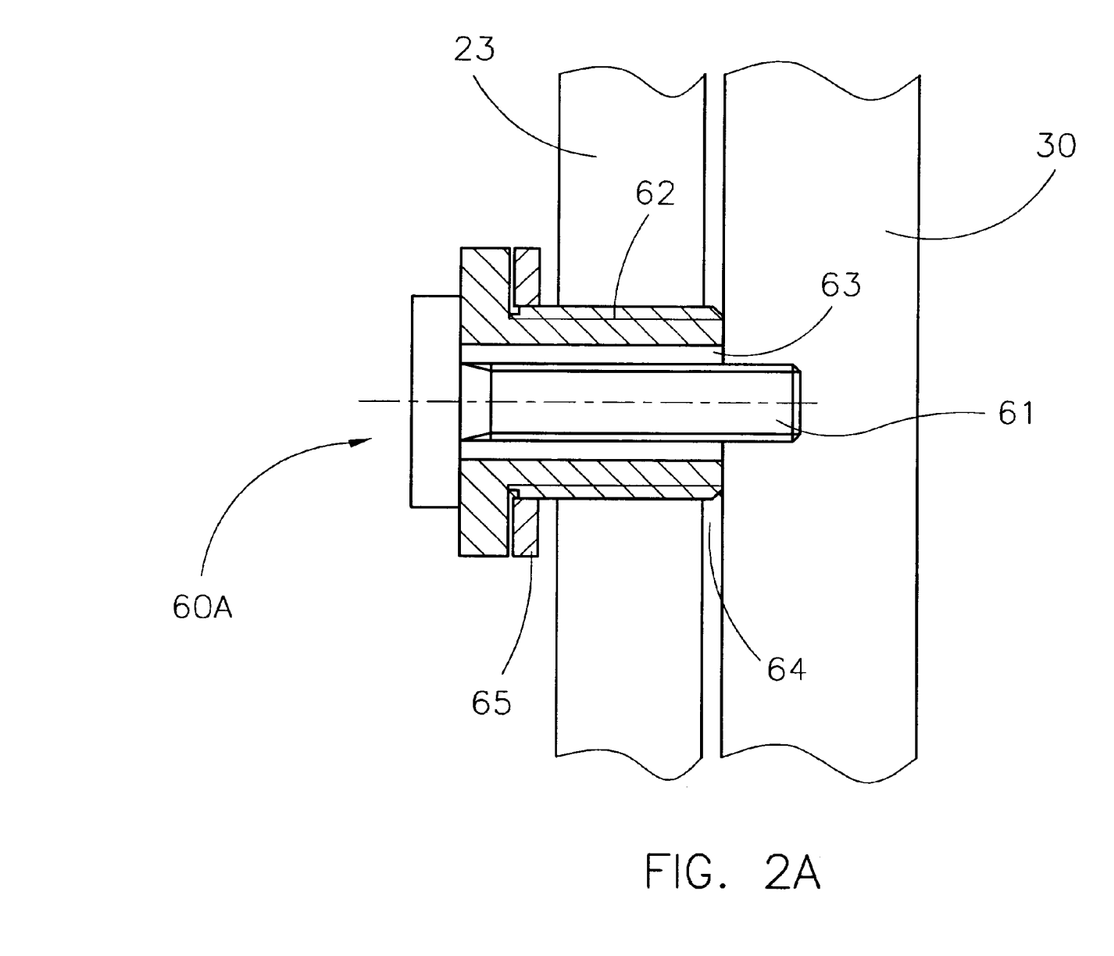
FIG. 2A is a sectional view of the inclination adjusting device of the present invention.
Figure 2B:
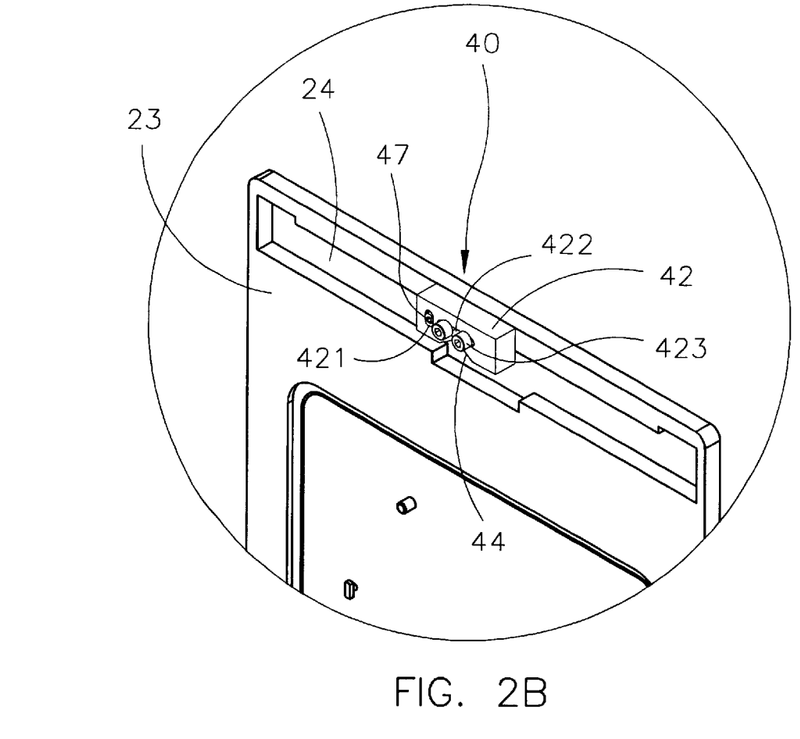
FIG. 2B is an enlarged partial view of the connecting device of the present invention.
Figure 2C:
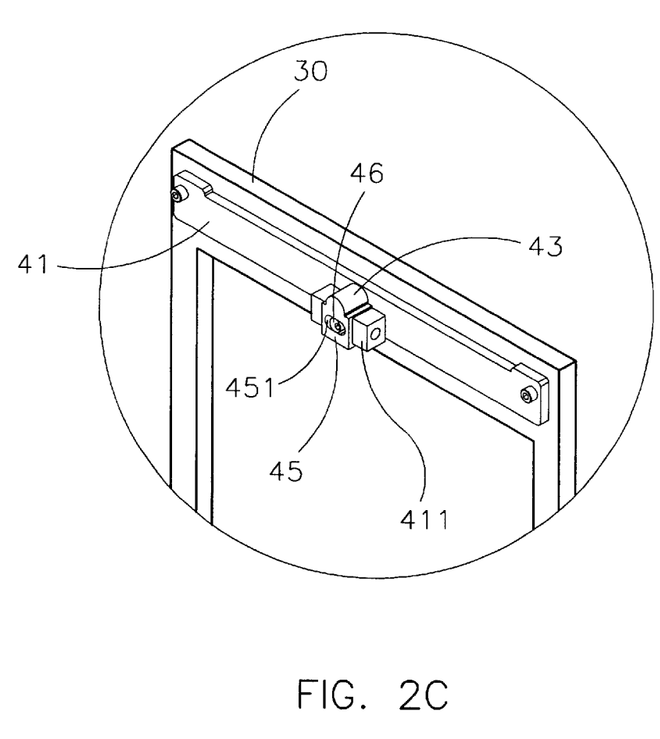
FIG. 2C is an enlarged partial view of the connecting seat of the present invention.

The connecting block 45 and the holding seat 42 have locations on the positioning frame 30 and the rear plate 23, respectively, that are adjustable vertically and horizontally. Adjusting is done as follows. A horizontally elongated hole 451 is placed in a middle position of the connecting block 45. The connecting seat 41 at a central position thereof has an eccentric cam 46, which is rotatably mounted. The eccentric cam 46 extends into the elongated hole 451. On both ends of the elongated hole 451, mounted at the central position of the connecting seat 41, two clamping pieces 411 fix the connecting block 45, restricting a vertical movement thereof. A fixing screw 412 on one of the clamping pieces 411 fastens the connecting block 45 after vertical adjusting thereof, so as to fix the connecting block 45 vertically. Thus, when a user wants to adjust the loading system 20 vertically, she or he loosens the fixing screw 412 and turns the eccentric cam 46 to drive the connecting block 45 upward or downward, achieving the object of vertical adjusting of the loading system 20.

Figure 4:
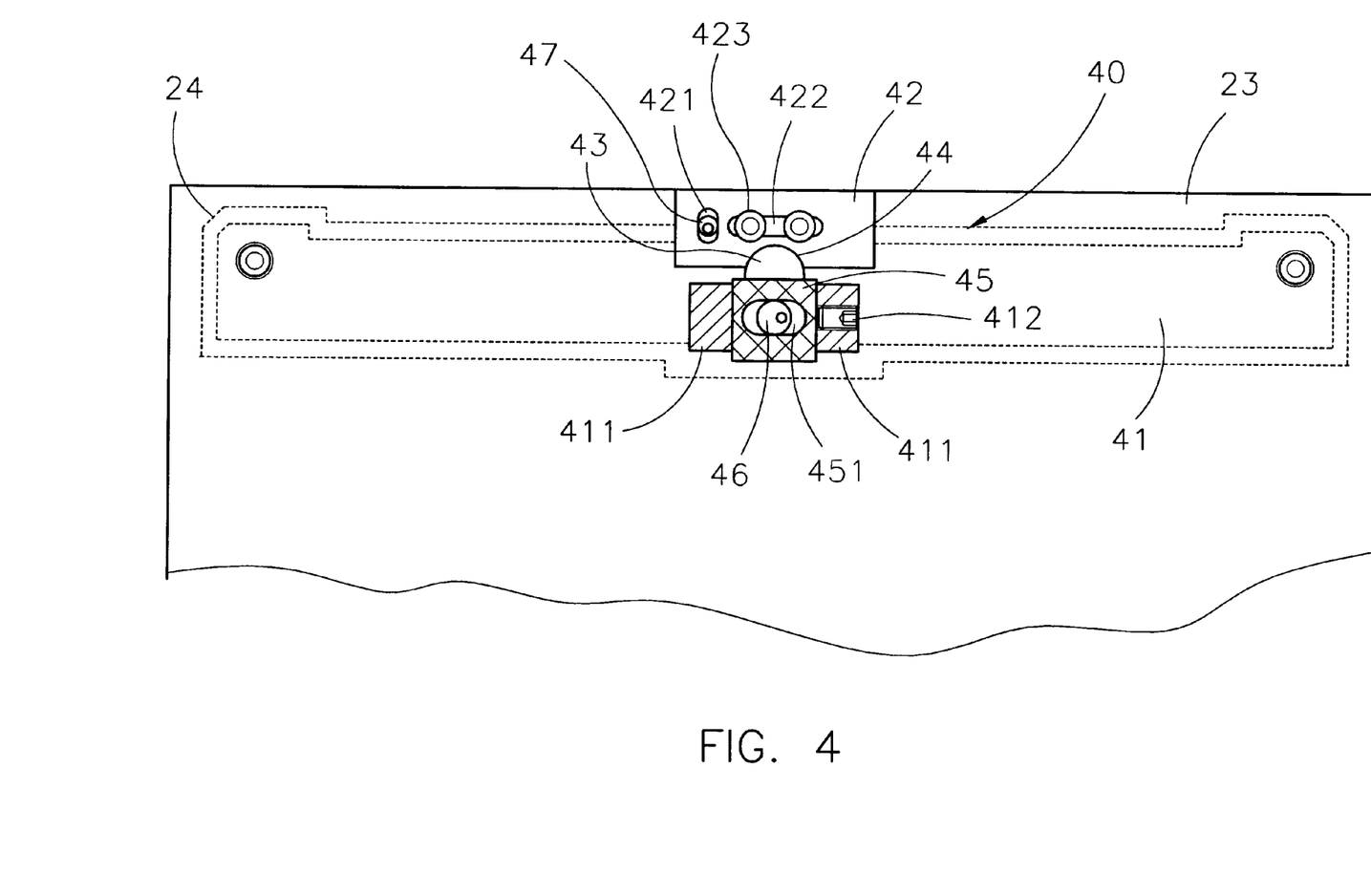
FIG. 4 is a plan view of the operation of the connecting device of the present invention.

Furthermore, the holding seat 42 is horizontally adjustable with respect to the rear plane 23 to adjust the horizontal position of the loading system 20 relative to the connecting frame 30. Referring to FIG. 4, the holding seat 42 at a central position thereof has a horizontally elongated hole 422. Two screws 423 pass through the elongated hole 422, fastening the holding seat 42 to the rear plate 23. An eccentric cam 47 is rotatably mounted on the rear plate 23. The holding seat 42 further has a vertically elongated hole 421, with the eccentric cam 47 extending thereinto. When the user wants to adjust the holding seat 42 horizontally, she or he loosens the screws 423 and turns the eccentric cam 46 to drive the holding seat 42 horizontally. After adjusting is finished, the user tightens the screws 423 to fix the holding seat 42 horizontally. The eccentric cam 47 allows to adjust the holding seat 42 horizontally, achieving the object of horizontal adjusting of the loading system 20 with respect to the positioning frame 30.

The connecting device 40 enables the user to adjust the horizontal and vertical positions of the loading system 20 relative to the connecting frame 30. The loading system 20 initially is placed at the positioning frame 30, then fastened at a fixed position. The main advantage of the connecting device 40 of the present invention is that the holding seat 42 and the connecting seat 41 are mounted in high positions and that the eccentric cams 46, 47 are accessible from the front side of the loading system 20. Thus the user performs adjusting of the holding seat 42 and the positioning element 43 from the front side of the loading system 20, readily and conveniently positioning the loading system 20 with respect to the positioning frame 30.

The base 21 has a lifting mechanism 50 for raising the loading system 20, lifting the holding seat 42 above the connecting seat 41, so that the holding groove 44 of the holding seat 42 is enabled to engage with the positioning element 43.

Figure 3:
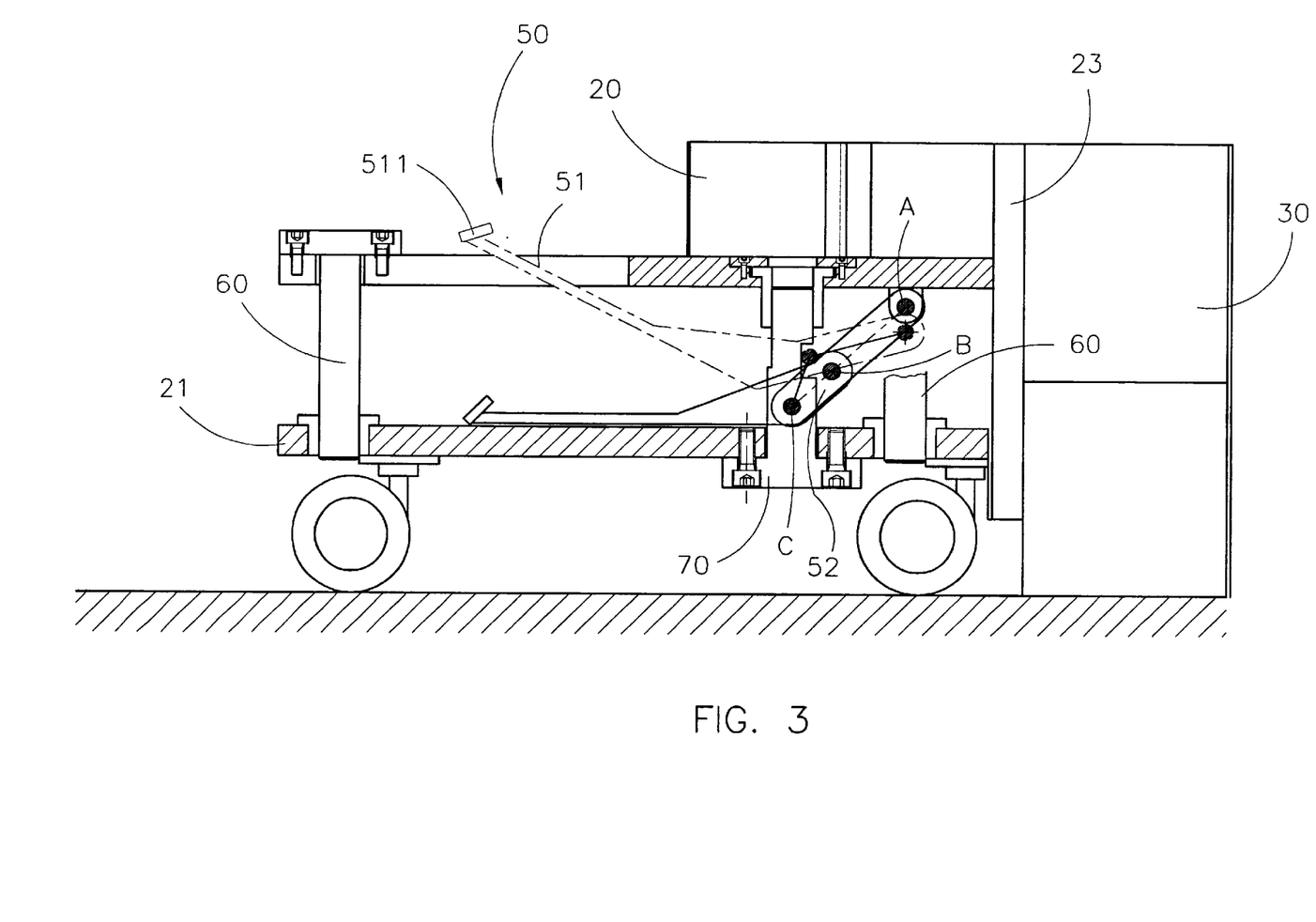
FIG. 3 is an enlarged partial view of the lifting mechanism of the present invention on the loading device.

Referring to FIG. 3, vertical gliding rails 60 are set on the base 21, allowing the loading system 20 to glide thereon vertically, as driven by the lifting mechanism 50. The lifting mechanism 50 comprises: a pedal lever 51, having a relatively short end that is hingedly connected with the lower end of the loading system 20 at a pivot A and a relatively long end that extends above the rear end of the base 21 and to which a pedal tread 511 is attached; a guiding rod 70, having a lower end fastened to the base 21 and an upper end gliding against the loading system 20; and a connecting rod 52 with a first end that is hingedly connected with the guiding rod at a pivot C and a second end that is hingedly connected with a middle point of the pedal lever 51 at a pivot B. As shown in FIG. 3, the connecting rod 52 and the relatively short end of the pedal lever 51 form a toggle mechanism. Treading on the relatively long end of the pedal lever 51 causes the connecting rod 52 and the relatively short end of the pedal lever 51 to form a line, the relatively short end of the pedal lever 51 rises, lifting the loading system 20. Since the connecting rod 52 and the relatively short end of the pedal lever 51 form a line, the points A, B, C become aligned. Therefore the user, by treading on the relatively long end of the pedal lever 51, lifts the loading system 20 effortlessly.

Furthermore, an inclination adjusting device 60A is placed at a high middle location on the rear plate 23, serving to adjust an inclination angle resulting in a gap between the rear plate 23 of the loading system 20 and the positioning frame 30. As shown in FIGS. 2 and 2A, the inclination adjusting device 60A comprises: a fixing screw 61, passing through the rear plate 23 and having a free end that is screwed into the positioning frame 30; and an adjusting screw 62, having a thread that engages with the rear plate 23 and thus, by being turned, having an adjustable penetrating depth. The adjusting screw 62 has a central hole 63, passed through by the fixing screw 61. The fixing screw 61 and the adjusting screw 62 have front ends that are cut in parallel, allowing to be turned simultaneously. The adjusting screw 62 has a front face of the front end thereof that is in contact with the rear face of the front end of the fixing screw 61, limiting how far the adjusting screw 62 protrudes. For turning the adjusting screw 62, first the fixing screw 61 is loosened, then the distance 64 between the rear plate 23 and the positioning frame 30 at the inclination adjusting device 60A is altered. Thus the object of adjusting the inclination angle given by the distance 64 between the rear plate 23 and the positioning frame 30 is achieved. Finally the fixing screw 61 is tightened again.

The method of the present invention is explained below:

a. Mounting the holding seat 42 and the connecting seat of the connecting device on the wafer loading system and the positioning frame 30, respectively;

b. pushing the wafer loading system 20 against the front side of the positioning frame 30;

c. treading on the pedal lever 51, raising the wafer loading system 20 on the lifting mechanism 50;

d. stopping the pedal lever at contact with the base 21, finishing raising of the lifting mechanism 50;

e. pushing forward the holding seat 42 on the wafer loading system 20 to a position above the positioning element 43 on the positioning frame 30;

f. releasing the pedal lever 51, so that the holding groove of the holding seat 42 on the wafer loading system 20 engages with the positioning element 43 on the positioning frame 30 from above;

g. checking whether the four holes 231 on the lower end of the rear plate 23 align with the threaded holes 31 of the positioning frame 30;

h. adjusting the inclination angle between the rear plate and the positioning frame, establishing a connection between both;

i. fixing the connection by screwing.

If during assembly the inclination angle between the rear plate 23 and the positioning frame 30 turns out to be not appropriate, adjusting is done using the inclination adjusting device on the rear plate 23 of the wafer loading device.

Moreover, if the four holes 231 on the lower end of the rear plate are not aligned with the threaded holes of the positioning frame, the wafer loading system 20 is separated from the positioning frame 30 and the eccentric cams 46, 47 on the connecting block 45 and the holding seat 42 are turned to adjust the connecting block 45 and the holding seat 42 vertically and horizontally, respectively. The method given above enables docking of the wafer loading device on the positioning frame 30.

Figure 5A:
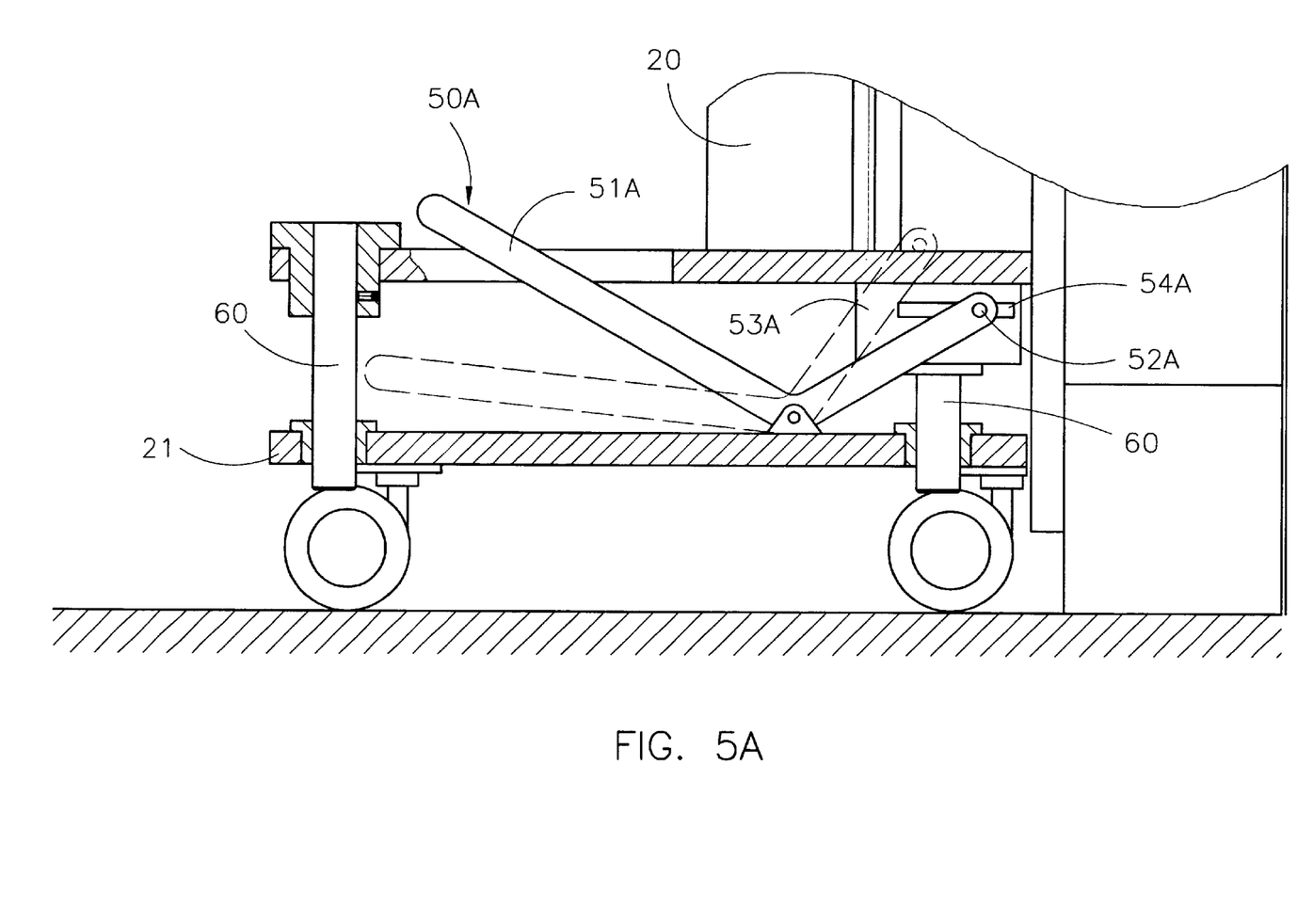
FIGS. 5A to 5E are schematic illustrations of modifications of the lifting mechanism of the present invention.

Referring to FIGS. 5A–5E, the lifting mechanism 50 of the present invention has further modifications. As shown in FIG. 5A, a lifting mechanism 50A comprises: a lever 51A with a far end, which carries a bolt 52A; a connecting plate 53A, mounted on the lower side of the loading system 20; and a horizontal guiding groove 54A in the connecting plate 53A. The bolt 52A on the far end of the lever 51A glides in the guiding groove 54A. The lever 51A at a central part thereof is hingedly connected with the base 21 and has a front end to be trodden on. When a user treads on the front end of the lever 51A, the far end thereof goes up, the bolt 52A pushes up the connecting plate 53A, and the loading system is lifted.

Figure 5B:
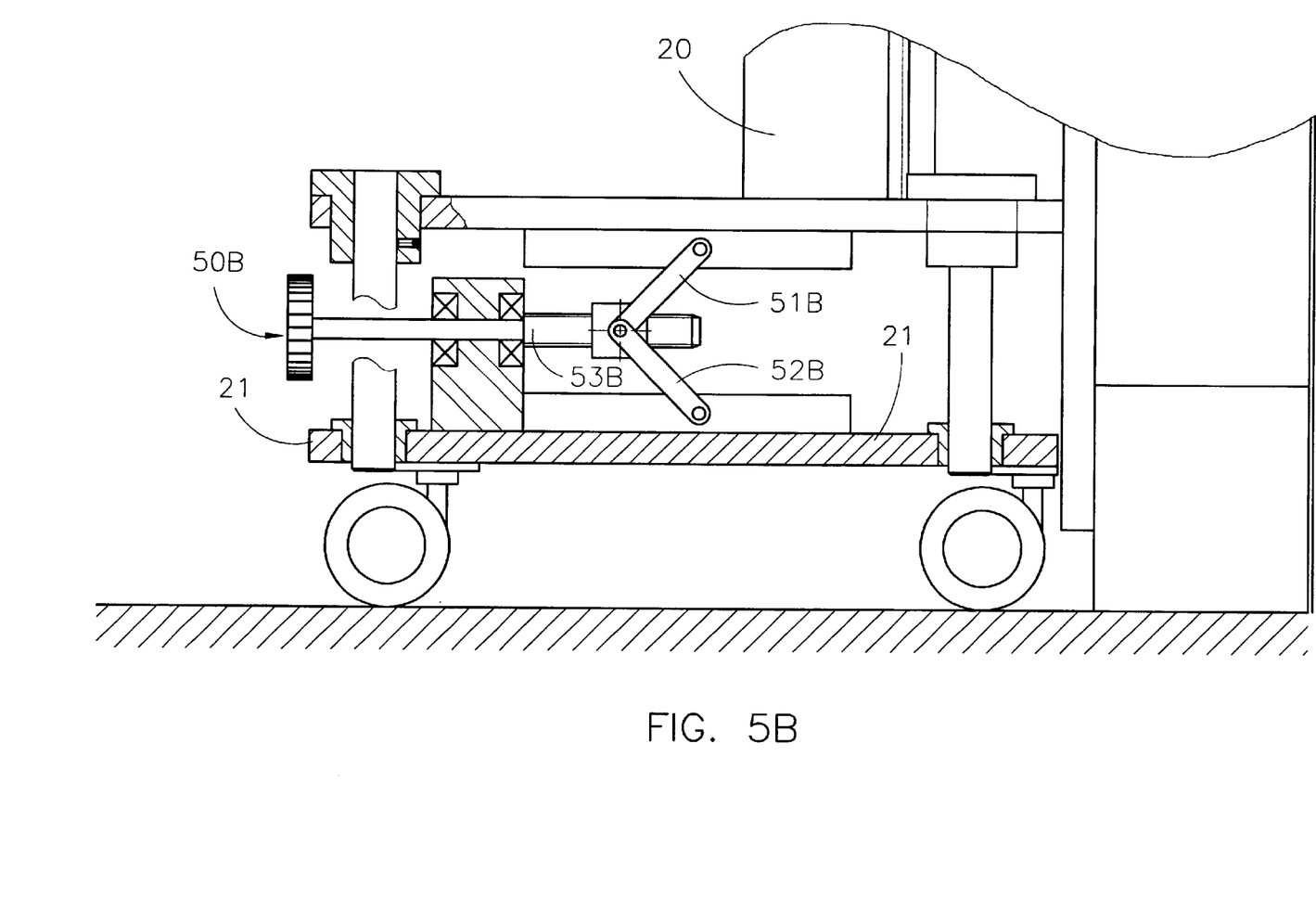

Referring to FIG. 5B, a lifting mechanism 50B comprises a first connecting rod 51B and a second connecting rod 52B. The first connecting rod 51B and the second connecting rod 52B are connected to each other, having free ends that are connected to the base 21 and the loading system, respectively. A threaded pushing rod 53B is horizontally mounted on the base 21, connecting with the first connecting rod 51B and the second connecting rod 52B at a single point. When the user turns the threaded pushing rod 53B, the threaded pushing rod 53B moves horizontally, spreading the first connecting rod 51B and the second connecting rod 52B apart, so that the loading system 20 is moved upward. Thus the user controls raising and lowering of the loading system.

Figure 5C:
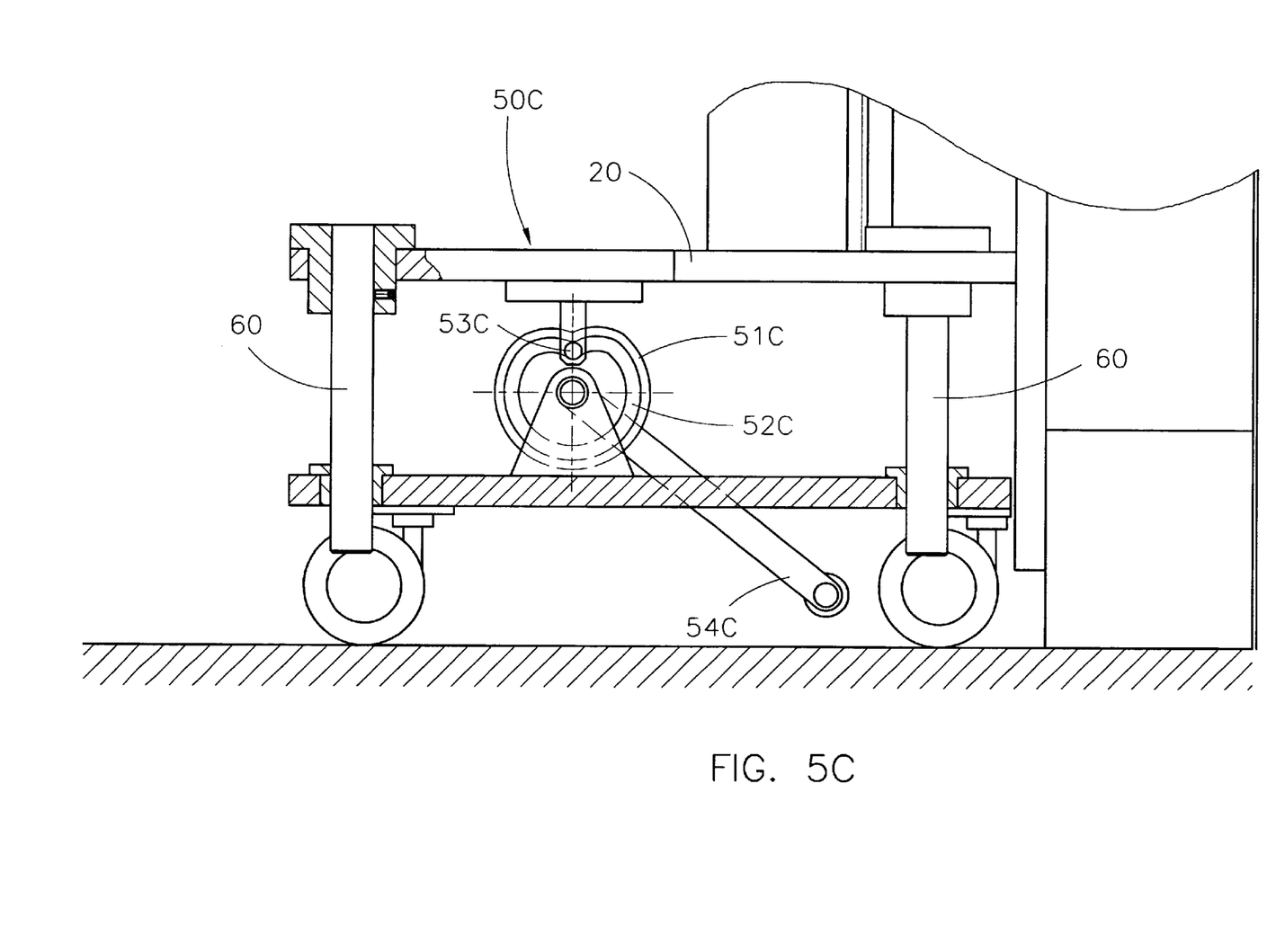

Referring to FIG. 5C, a lifting mechanism 50C has a rotatable cam 51C with a projection 52C. A connecting bolt 53C is fastened to the lower side of the loading system 20, leaning on the projection 52C. The cam 51C has a center acted on by a handle 54C, which extends along a side of the loading system 20. By operating the handle 54C, the user turns the cam 51C, so that the projection 52C thereof drives the loading system 20 upward and downward.

Figure 5D:
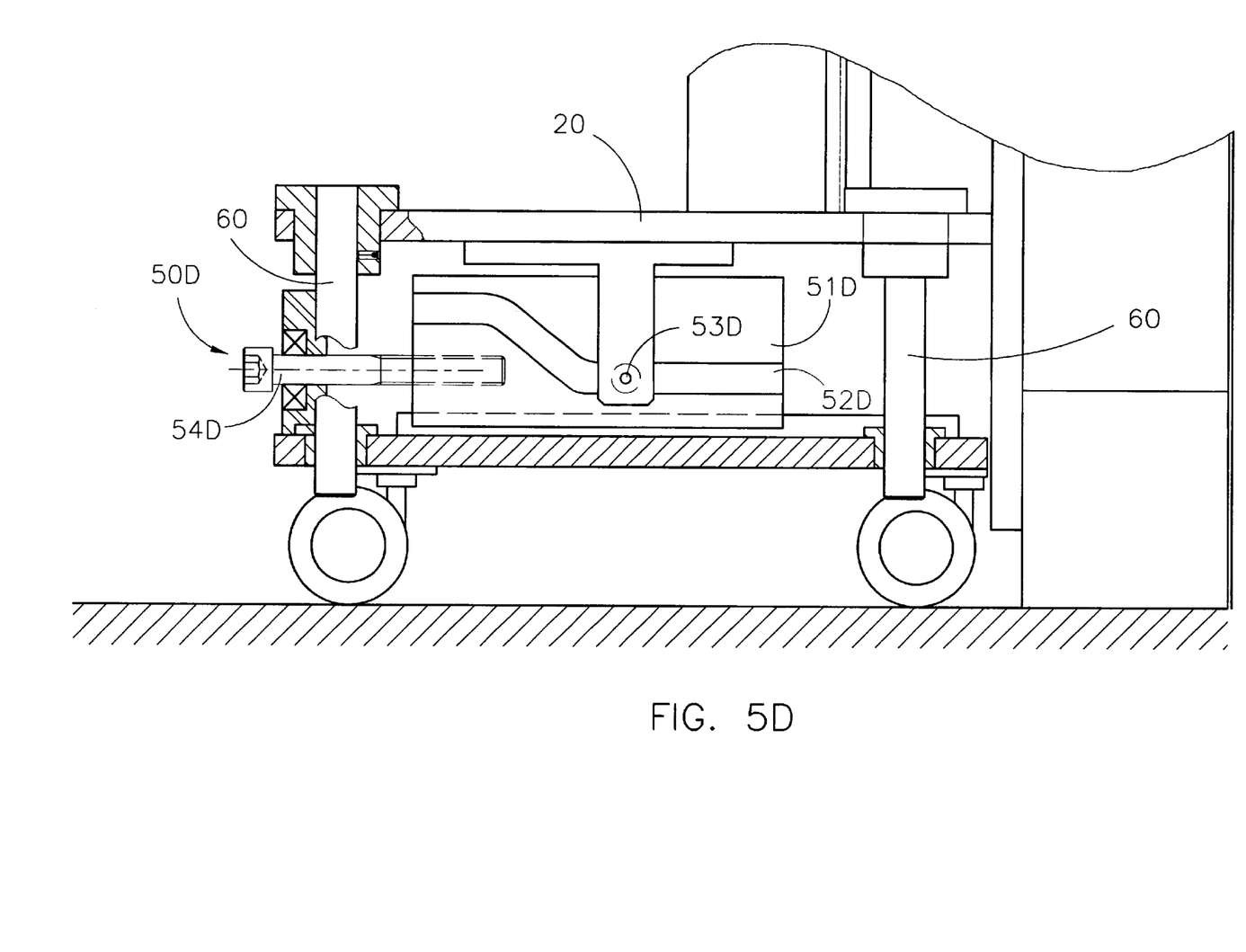

Referring to FIG. 5D, a driving device 50D comprises: a driving cam plate 51D, having a driving groove 52D; a connecting bolt 53D, fastened to the lower side of the loading system 20 and engaging with the driving groove 52D, thereby driven vertically; and a threaded pushing rod 54D, driving the driving cam plate 51D horizontally. When the user turns the threaded pushing rod 54D, the driving cam plate 51D is pushed, driving the loading system 20 upward and downward.

Figure 5E:
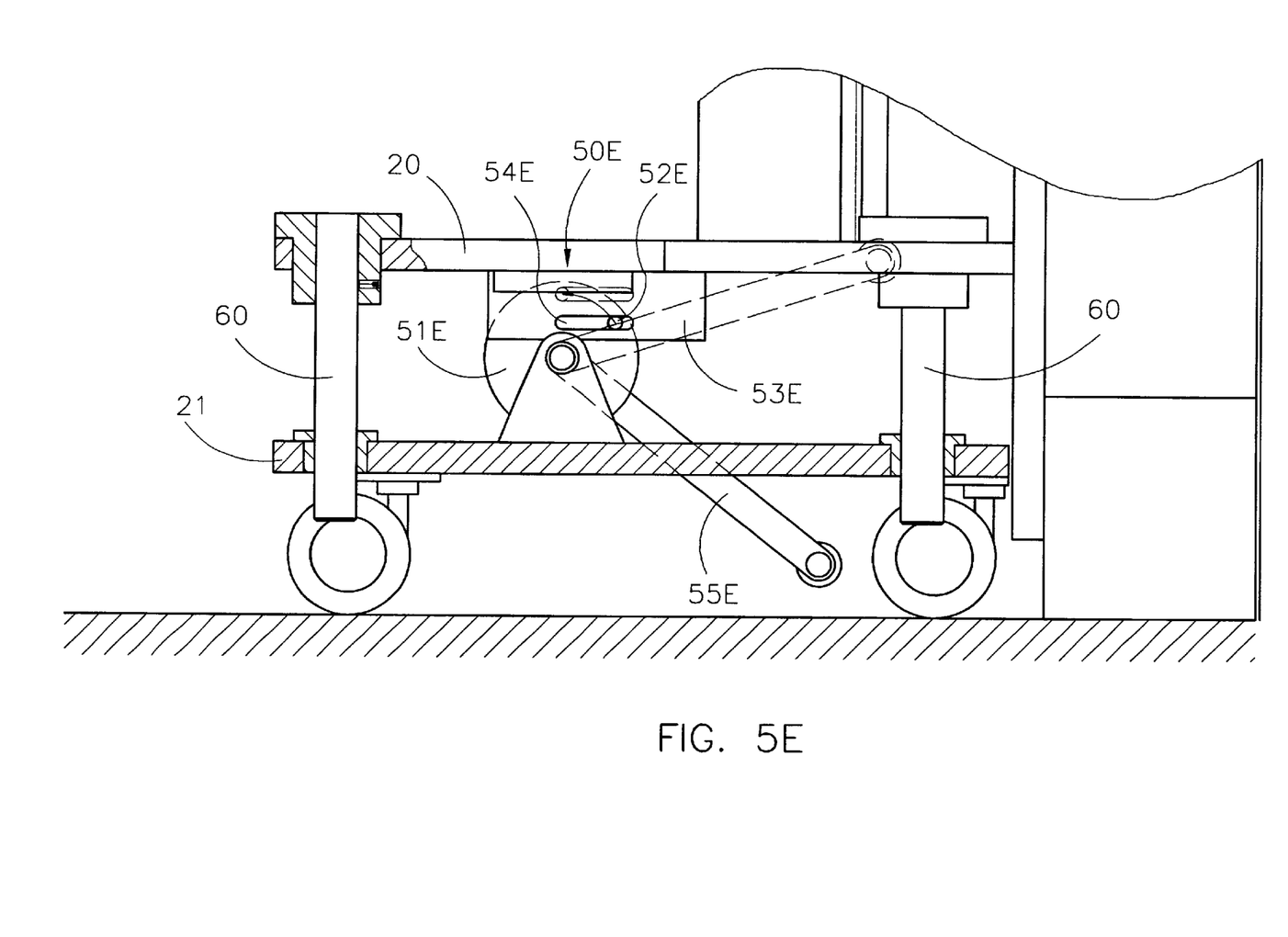

Referring to FIG. 5E, a lifting mechanism 50E comprises an eccentric cam 51E, carrying a driving bolt 52E; a connecting plate 53E, fastened to the lower side of the loading system 20; a guiding groove 54E, cut into the connecting plate 53E and engaging with the driving bolt 52E; and a handle 55E, connected with the eccentric wheel 51E and extending along a side of the loading system 20, allowing the user to turn the eccentric cam 51E. The eccentric cam 51E drives a vertical movement of the connecting plate 53E, taking along the loading system.

While the invention has been described with reference to preferred embodiments thereof, it is to be understood that modifications or variations may be easily made without departing from the spirit of this invention which is defined by the appended claims.

What is claimed is:

1. A wafer loading system positioning device, comprising:
    a loading system for docking on a positioning frame of a semiconductor production equipment, having a base at a lower part and a rear plate, said rear plate, for docking, connected with said positioning frame and positioned thereon, said rear plate having an upper part, with a connecting system being mounted between said upper part of said rear plate and said positioning frame for positioning said loading system on said positioning frame, said connecting device further comprising
        a holding seat on said upper part of said rear plate, having a lower side with a holding groove,
        a connecting seat on an upper part of a front side of said positioning frame, having a middle part from which a positioning element extends upward,
        an opening, cut through said rear plate at a location below said holding seat, allowing said connecting seat to be passed through, so that said positioning element, put through from a rear side of said rear plate, appears at a front side of said rear plate at a location suitable to engage with said holding groove, and
        a horizontal adjusting device and a vertical adjusting device, respectively placed on said holding seat and said connecting seat for horizontal and vertical adjusting of a relative position of said holding seat with respect to said positioning element; and
    a lifting mechanism, located between said base and said positioning system and used to raise said loading system for lifting said holding seat above said positioning element, so as to enable said holding seat to engage with said positioning element.

2. A wafer loading system positioning device according to claim 1, wherein an inclination adjusting device is mounted on a central part of said rear plate on two sides for adjusting a gap given by an inclination angle between said rear plate and said positioning frame.

3. A wafer loading system positioning device according to claim 2, wherein said inclination adjusting device comprises an adjusting screw, rotatably mounted on said rear plate, and a fixing screw, passing through said adjusting screw and having a far end screwed into said positioning frame.

4. A wafer loading system positioning device according to claim 1, wherein said lifting mechanism comprises a lever, hingedly connected with said base and having a first end that is in contact with a lower side of said loading system and a second end that is trodden on to raise said loading system.

5. A wafer loading system positioning device according to claim 1, wherein said lifting mechanism comprises:
    a transmission element;
    a driving element, fastened on a lower side of said loading system and connected with said transmission element, so that a vertical movement of said loading system is driven by said transmission element; and
    a driving device for driving a movement of said transmission element by a user.

6. A wafer loading system positioning device according to claim 5, wherein said transmission element of said lifting mechanism is a turning cam and said driving device is a handle driving a turning movement of said cam.

7. A wafer loading system positioning device according to claim 5, wherein said transmission element of said lifting mechanism is a linearly moving transmission plate and said driving device is a threaded rod driving a linear movement of said transmission plate.

8. A wafer loading system positioning device according to claim 1, wherein said connecting seat and said holding seat each have an elongated hole and an eccentric cam engaging with said elongated hole, allowing horizontal and vertical adjusting of said relative position of said holding seat with respect to said positioning element.

9. A wafer loading system positioning device according to claim 1, wherein two clamping pieces are placed on two sides of said connecting seat for vertical fixing thereof.

10. A wafer loading system positioning device according to claim 9, wherein clamping pieces have a fixing screw, fixing a connecting block.

11. A wafer loading system positioning device according to claim 1, wherein said holding seat has an elongated hole and a screw for fastening said holding seat on said rear plate at a horizontally adjustable position.

12. A wafer loading system positioning device according to claim 8, wherein said holding seat has an elongated hole and a screw for fastening said holding seat on said rear plate at a horizontally adjustable position.

13. A wafer loading system positioning device, comprising:
    a holding seat, mounted on an upper part of a rear plate of a wafer loading system, having a lower side with a holding groove;
    an opening, cut through said rear plate at a location below said holding seat; and
    a lifting mechanism, set on a lower part of said wafer loading system for raising said wafer loading system, so as to establish a connection thereof with a production equipment.

* * * * *